(12) United States Patent
Slamowitz

(10) Patent No.: US 7,227,411 B2
(45) Date of Patent: Jun. 5, 2007

(54) APPARATUS FOR A DIFFERENTIAL SELF-BIASING CMOS AMPLIFIER

(75) Inventor: Mark Slamowitz, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/463,172

(22) Filed: Jun. 17, 2003

(65) Prior Publication Data

US 2004/0257159 A1    Dec. 23, 2004

(51) Int. Cl.
*H03F 3/45* (2006.01)
(52) U.S. Cl. ............................ 330/253; 330/261
(58) Field of Classification Search ............... None
See application file for complete search history.

(56) References Cited

U.S. PATENT DOCUMENTS

| | | | | |
|---|---|---|---|---|
| 4,074,150 A | 2/1978 | Buckley, III et al. | ...... | 307/362 |
| 4,074,151 A | 2/1978 | Buckley, III et al. | ...... | 307/362 |
| 4,430,582 A | 2/1984 | Bose et al. | ...... | 307/297 |
| 4,437,024 A | 3/1984 | Wacyk | ...... | 307/475 |
| 4,438,352 A | 3/1984 | Mardkha | ...... | 307/475 |
| 4,477,736 A | 10/1984 | Onishi | ...... | 307/297 |
| 4,563,595 A | 1/1986 | Bose | ...... | 307/290 |
| 4,677,321 A | 6/1987 | Bacrania | ...... | 307/475 |
| 4,769,564 A * | 9/1988 | Garde | ...... | 327/52 |
| 4,937,476 A | 6/1990 | Bazes | ...... | 307/475 |
| 5,278,467 A * | 1/1994 | Nedwek | ...... | 327/52 |
| 5,942,940 A * | 8/1999 | Dreps et al. | ...... | 330/253 |
| 6,566,926 B1 * | 5/2003 | Patterson | ...... | 327/206 |
| 6,642,790 B2 * | 11/2003 | Schrodinger et al. | ...... | 330/253 |

OTHER PUBLICATIONS

Mel Bazes, "Two Novel Fully Complementary Self-Biased CMOS Differential Amplifiers", IEEE Journal Of Solid-State Circuits, vol. 26, No. 2, Feb. 1991, pp. 165-168.

* cited by examiner

*Primary Examiner*—Khanh Van Nguyen
(74) *Attorney, Agent, or Firm*—McAndrews Held & Malloy Ltd.

(57) ABSTRACT

Aspects of the invention provide a self-biasing differential amplifier. The self-biasing differential amplifier may include a first input stage and a biasing transistor pair coupled to the first input stage. A second input stage may be coupled to the first input stage and the biasing transistor pair. The first input stage of the self-biasing differential amplifier may include a first PMOS transistor coupled to a first NMOS transistor in an inverter arrangement. The second input stage may include a second PMOS transistor coupled to a second NMOS transistor. The biasing transistor pair may include a third PMOS transistor coupled to a third NMOS transistor.

24 Claims, 5 Drawing Sheets

APPARATUS FOR A DIFFERENTIAL SELF-BIASING CMOS AMPLIFIER

CROSS-REFERENCE TO RELATED APPLICATIONS/INCORPORATION BY REFERENCE

Not Applicable.

FIELD OF THE INVENTION

Certain embodiments of the invention relate to differential amplifiers. More specifically, certain embodiments of the invention relate to an apparatus for a self-biasing or self-referencing differential amplifier.

BACKGROUND OF THE INVENTION

A transistor is an electronic device that permits current flow in electronic circuits. In this regard, the transistor permits the current to flow in a controlled manner whenever an electronic circuit attempts to push current through the transistor. In this manner, the transistor generically operates as a regulator or valve, which regulates the flow of current.

FIG. 1 illustrates an exemplary conventional complementary metal oxide semiconductor (CMOS) transistor arrangement. Referring to FIG. 1, the conventional CMOS transistor arrangement 24 includes an n-channel MOS (NMOS) transistor 18 and a p-channel MOS (PMOS) transistor 20. The conventional CMOS arrangement 24 also includes a p-substrate 14, for example a $p^-$-substrate. The NMOS transistor 18 is disposed within the p-substrate 14. The NMOS transistor 18 includes a $p^+$-body contact (B), an $n^+$-source (S) and an $n^+$-drain (D) disposed in the p-substrate 14. A voltage source $V_{SS}$ 6 having a ground is coupled to the $p^+$-body contact (B) and the voltage source $V_{SS}$ 4 is coupled to the $n^+$-source (S) of NMOS transistor 18. An input line 2 is coupled to a gate (G) of the NMOS transistor 18. An output line 10 is coupled to the $n^+$-drain (D) of the NMOS transistor 18. The PMOS transistor 20 includes an n-well 22 that is disposed in the p-substrate 14. The PMOS transistor 20 also includes an $n^+$-body contact (B), a $p^+$-source (S) and a $p^+$-drain (D) disposed in the n-well 22. A voltage source $V_{DD}$ 8 is coupled to the $p^+$-source (S) and the $n^+$-body contact (B) of PMOS transistor 22. The input line 2 is also coupled to a gate of the PMOS transistor 20. The output line 10 is also coupled to the $p^+$-drain (D) of the PMOS transistor 20.

During normal operation of the conventional CMOS transistor arrangement 24, the voltage sources $V_{SS}$ 4, $V_{DD}$ 8 may be noisy. For example, the noise may be caused by other circuitry found on or coupled to the chip that may directly or indirectly affect the voltage sources $V_{SS}$ 4, $V_{DD}$ 8. High swing or high power devices such as, data drivers in a wire line communication system or transmitters in wireless communications systems, may be sources of noise. The noise may also be caused, for example, by the driving of active circuits. In one example, the voltage sources may be coupled to active circuitry such as active portions of an inverter circuit, which may cause transient currents to flow during signal transitions from a high level to a low level or from a low level to a high level. In another example, noise may be caused by transitions in a signal propagated or generated by the chip.

In the NMOS transistor 18, if the voltage source $V_{SS}$ 4, $V_{SS}$ 6 is noisy, then the noise may propagate to the p-substrate 14 via, for example, at least through the resistive coupling 9 between the $p^+$-body contact (B) and the p-substrate 14. In the PMOS transistor 20, if the voltage source $V_{DD}$ 8 is noisy, then the noise may propagate to the n-well 22 via the $n^+$-body contact (B) of the PMOS transistor 20 via a resistive coupling 12. The noise in the n-well 22 may propagate to the p-substrate 14 via, for example, at least the capacitive coupling 16 between the n-well 22 and the p-substrate 14. If the noise is able to propagate to the p-substrate 14, then noise may propagate to or otherwise affect other circuits on or off the chip that may be coupled to the p-substrate 14.

In order to mitigate the effects of impairments such as noise, transistors may be arranged so that they form a differential amplifier. Differential amplifiers form the basis of operational amplifiers, the latter of which are generally referred to as op amps. Differential amplifiers are electronic circuits, which are designed with an internal symmetry that is configured to cancel errors which are shared by both sides of the differential amplifier. These errors may include internal or external errors. Internal errors may include temperature changes, which in certain instances, may affect both sides of the operational amplifier to approximately the same degree. Transistor mismatch is another example of an internal error. Whenever both sides are affected to approximately the same degree, a nulling or canceling effect occurs. External errors may include noise picked up by inputs of the differential amplifier. In this regard, the differential amplifier may be adapted to eliminate common mode noise. Furthermore, the differential amplifier may require that the signal appear as a difference between waveforms occurring on either side of the differential amplifier. Accordingly, the differential amplifier may be configured to reject certain signal components such as noise and amplify desired signal components.

Some conventional differential amplifiers require a reference voltage or reference current in order for the differential amplifier to operate properly. Additionally, some differential amplifier designs utilize large numbers of transistors. In general, the greater the number of transistor devices, the greater the number of operating variables that will vary with respect to each of the sides of a differential amplifier. Consequently, differential amplifiers that utilize a large number of transistors may be more difficult to control and tune, and may also be less predictable with respect to process or operating variations. Furthermore, most conventional analog differential amplifiers are generally adapted to take a relatively small differential input voltage and produce as an output a voltage having a larger magnitude. These conventional analog differential amplifiers are usually optimized to operate in a specified voltage range and may not function at all if operated outside that range.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention provide an apparatus for a self-biasing differential amplifier. The self-biasing differential amplifier may include a first input stage and a biasing transistor pair coupled to the first input stage. A second input stage may be coupled to the first input stage and the biasing transistor pair. The first input stage of the self-biasing differential amplifier may include a first PMOS transistor coupled to a first NMOS transistor in an inverter arrangement. The second input stage may include a second PMOS transistor coupled to a second NMOS transistor. The biasing transistor pair may include a third PMOS transistor coupled to a third NMOS transistor. A gate of the first PMOS transistor may be coupled to a gate of the first NMOS transistor. A first input to the self-biasing differential amplifier may be coupled to the first PMOS transistor gate that is coupled to the first NMOS transistor gate. An input voltage source may be coupled to the first input of the self-biasing differential amplifier. By virtue of the inverter arrangement, a drain of the first PMOS transistor may be coupled to a drain of the first NMOS transistor.

A gate of the third PMOS transistor may be coupled to a gate of the third NMOS transistor. The drain of the first PMOS transistor that is coupled to a drain of the first NMOS transistor may also be coupled to the gate of the third PMOS transistor which is coupled to the gate of the third NMOS transistor. A source of the first NMOS transistor and a source of the third NMOS transistor may be coupled to a ground. A source of the second NMOS transistor may be coupled to a drain of the third NMOS transistor. A gate of the second PMOS transistor is coupled to a gate of the second NMOS transistor. A second input to the self-biasing differential amplifier may be coupled to the gate of the second PMOS transistor that is coupled to the gate of the second NMOS transistor. The second input of the self-biasing differential amplifier may be an input voltage source. A drain of the second PMOS transistor may be coupled to a drain of the second NMOS transistor. An output of the self-biasing differential amplifier may be coupled to the drain of the second PMOS transistor that is coupled to the drain of the second NMOS transistor. A source of the second PMOS transistor may be coupled to a source of the first PMOS transistor. A drain of the third PMOS transistor may be coupled to the source of the second PMOS transistor that is coupled to the source of the first PMOS transistor.

Another embodiment of the invention may include a method for providing a differential amplifier. The method may include generating an output signal from a first amplifier stage comprising a first PMOS transistor and a first NMOS transistor. An input signal to a biasing transistor pair may be controlled using the generated output from the first amplifier stage. An output signal may be generated from the second amplifier stage, the latter of which may be coupled to the first amplifier stage and the biasing transistor pair. The PMOS transistor and NMOS transistor of the first amplifier stage may be coupled to each other in an inverter arrangement. The method may further include incrementally turning off the third NMOS transistor, while simultaneously incrementally turning on the third PMOS transistor. The third NMOS transistor may also be incrementally turned on while simultaneously incrementally turning off the third PMOS transistor. The second PMOS transistor may also be turned on while simultaneously turning off the second NMOS transistor. Finally, the generated output from the first amplifier may be a reference signal.

These and other advantages, aspects and novel features of the present invention, as well as details of an illustrated embodiment thereof, will be more fully understood from the following description and drawings.

DETAILED DESCRIPTION OF THE INVENTION

Aspects of the invention provide a self-biasing differential amplifier. The self-biasing differential amplifier may include a first input stage and a biasing transistor pair coupled to the first input stage. A second input stage may be coupled to the first input stage and the biasing transistor pair. The first input stage of the self-biasing differential amplifier may include a first PMOS transistor coupled to a first NMOS transistor in an inverter arrangement. The second input stage may include a second PMOS transistor coupled to a second NMOS transistor. The biasing transistor pair may include a third PMOS transistor coupled to a third NMOS transistor.

The self-biasing differential amplifier in accordance with an embodiment of the invention is in a class of differential amplifier designs that may be implemented with relatively few transistors making it very compact and flexible. The self-biasing differential amplifier does not require any other reference voltage or reference current to be supplied to ensure proper functionality. Since the self-biasing differential amplifier is implemented with a few transistors, transistor-matching issues are minimal when compared with conventional differential amplifier designs that utilize a greater number of transistors. Accordingly, fewer transistor devices may translate to less complexity and fewer operating variables that may vary with respect to each of the sides of the differential amplifier. In accordance with an aspect of the invention, operation of the self-biasing differential amplifier may be more controlled and predictable with respect to process or operating variations, than with conventional differential amplifiers. Furthermore, the self-biasing differential amplifier in accordance with the invention may eliminate the need for a voltage reference or current reference, thereby minimizing complexity. Additionally, the input voltage of the self-biasing differential amplifier may be configured so that full output CMOS logic levels may be achieved.

Figure 1:
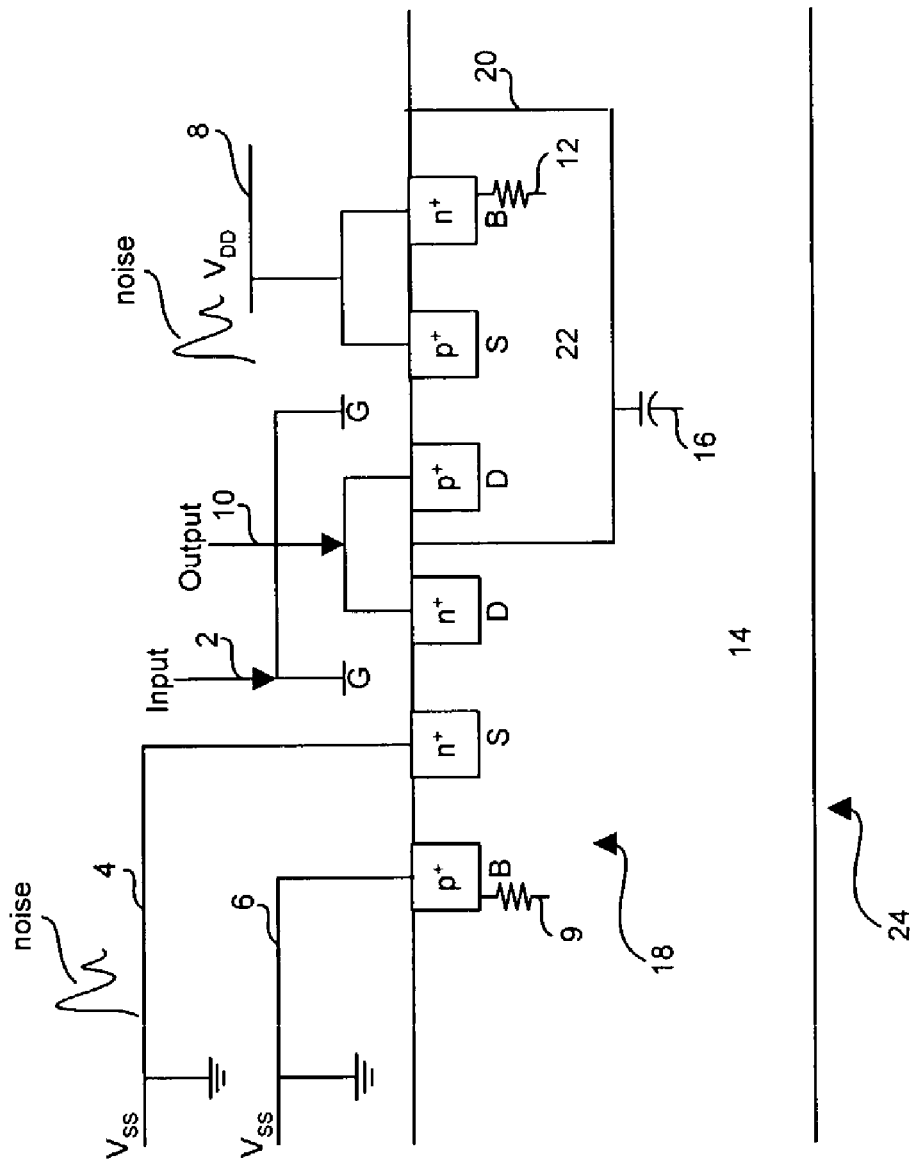
FIG. 1 illustrates an exemplary conventional complementary metal oxide semiconductor (CMOS) transistor arrangement.
Figure 2:
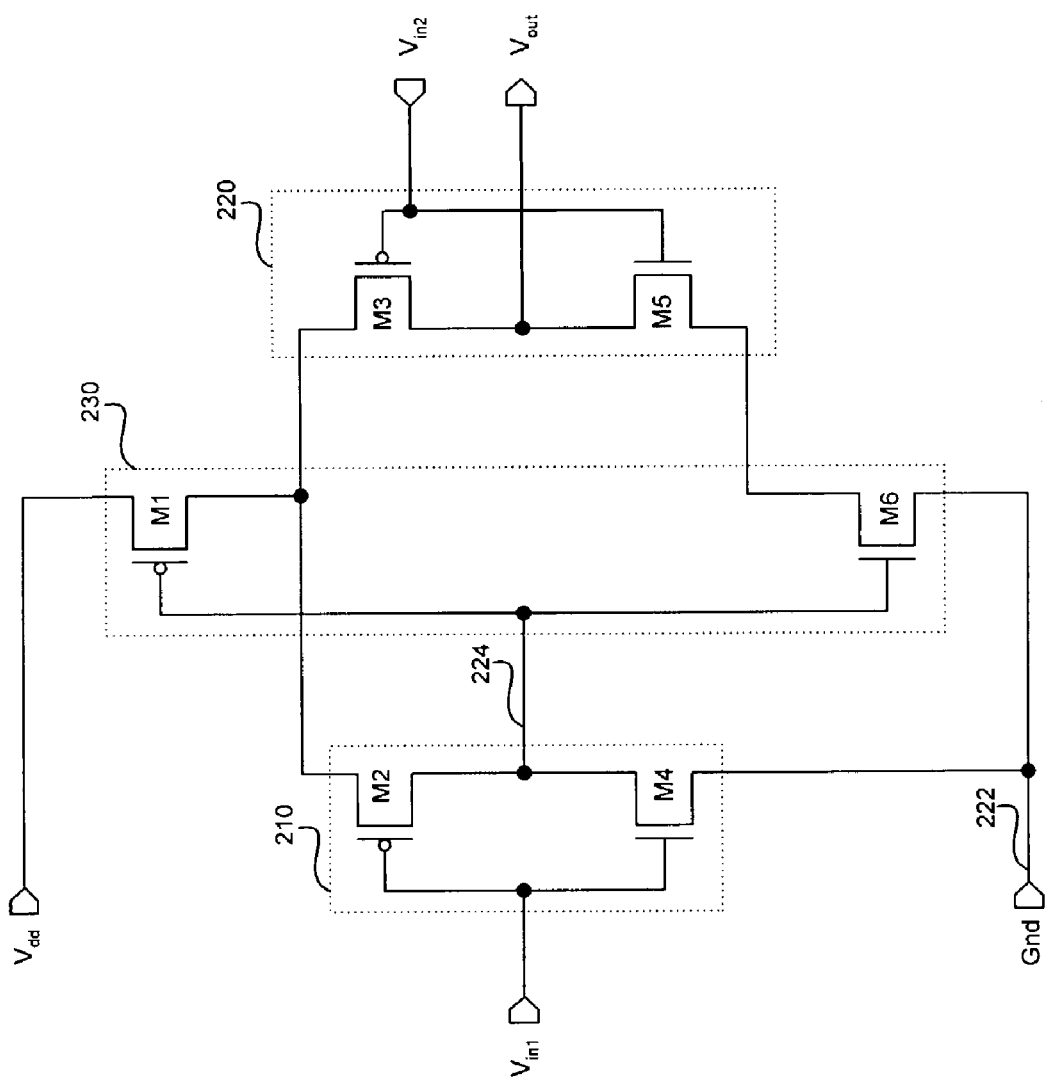
FIG. 2 is a schematic diagram of a self-biasing differential amplifier in accordance with an embodiment of the invention.

FIG. 2 is a schematic diagram of a self-biasing differential amplifier in accordance with an embodiment of the invention. Referring to FIG. 2, there is shown PMOS transistors M1, M2, M3 and NMOS transistors M4, M5, M6. PMOS transistor M2 and NMOS transistor M4 may be arranged to form a first amplifier stage 210. PMOS transistor M3 and NMOS transistor M5 may be arranged to form a second amplifier stage 220. PMOS transistor M1 and NMOS transistor M6 may be arranged to form a biasing transistor pair 230.

Referring to the first amplifier stage 210, a gate of the PMOS transistor M2 may be coupled to a gate of the NMOS transistor M4. The coupled gates of the PMOS transistor M2 and the NMOS transistor M4 may be coupled to a first voltage source $V_{in1}$. A drain of the PMOS transistor M2 may be coupled to a drain of the NMOS transistor M4. The source of the NMOS transistor M4 may be coupled to a ground 222.

Referring to the second amplifier stage 220, a gate of the PMOS transistor M3 may be coupled to a gate of the NMOS transistor M5. The coupled gates of the PMOS transistor M3 and the NMOS transistor M5 may be coupled to a second voltage source $V_{in2}$. A drain of the PMOS transistor M3 may be coupled to a drain of the NMOS transistor M5. The coupled drain of the PMOS transistor M3 and the drain of the NMOS transistor M5 may be coupled to an amplifier output, namely $V_{out}$. A source of the PMOS transistor M2 in the first amplifier stage 210 may be coupled to a source of the PMOS transistor M3 in the second amplifier stage 220.

Referring to the biasing transistor pair 230, a gate of the PMOS transistor M1 may be coupled to a gate of the NMOS transistor M6. The coupled gates of the PMOS transistor M1 and the NMOS transistor M6 may be coupled to an output 224 of the first amplifier stage 210. A source of the NMOS transistor M6 may be coupled to the ground 222. A source of the PMOS transistor M1 may be coupled to a voltage source $V_{dd}$. The coupled sources of the PMOS transistor M2 in the first amplifier stage 210 and the PMOS transistor M3 in the second amplifier stage 220 may be coupled to a drain of the PMOS transistor M1. Finally, a source of the NMOS transistor M5 may be coupled to a drain of the NMOS transistor M6. The coupled gates of the PMOS transistor M1 and the NMOS transistor M6, which is coupled to the output 224 of the first amplifier stage 210, may be adapted to function as a reference signal. In this regard, the self-referencing or self-biasing differential amplifier in accordance with the invention may not require any additional reference voltage or reference current source.

The first amplifier stage 210 provides a first processing path and the second amplifier stage 220 provides a second processing path for the self-biasing differential amplifier. The biasing transistor pair 230 may be adapted to control biasing of the first amplifier stage 210 and the second amplifier stage 220 for the self-biasing differential amplifier.

Figure 3A:
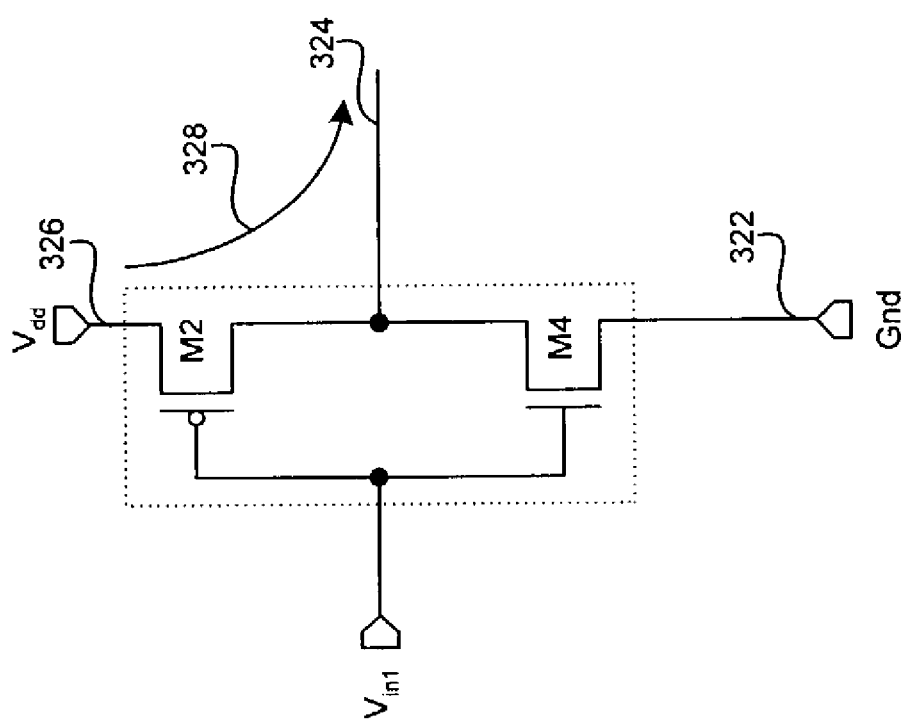
FIG. 3a illustrates an inverter arrangement of the first stage of the self-biasing differential amplifier of FIG. 1 in accordance with an embodiment of the invention.

The first amplifier stage 210 may be adapted to operate as an inverter. FIG. 3a illustrates an inverter arrangement of the first stage of the self-biasing differential amplifier of FIG. 2 in accordance with an embodiment of the invention. Referring to FIG. 3a, there is shown a PMOS transistor M2 coupled to an NMOS transistor M4. The PMOS transistor M2 and the NMOS transistor M4 are coupled in a similar arrangement to the coupling of the first amplifier stage 210 of FIG. 2. However, a voltage source 326, namely $V_{dd}$, may be coupled to the source of the PMOS transistor M2. In operation, logic one (1) at input $V_{in1}$ results in logic zero (0) at output 324. Similarly, logic zero (0) at input $V_{in1}$ results in logic one (1) at output 324. In FIG. 3a, reference 328 indicates the current flow from $V_{dd}$ 326 to the output 324 in instances where there is logic zero (0) at input $V_{in1}$, which results in logic one (1) at output 324.

Figure 3B:
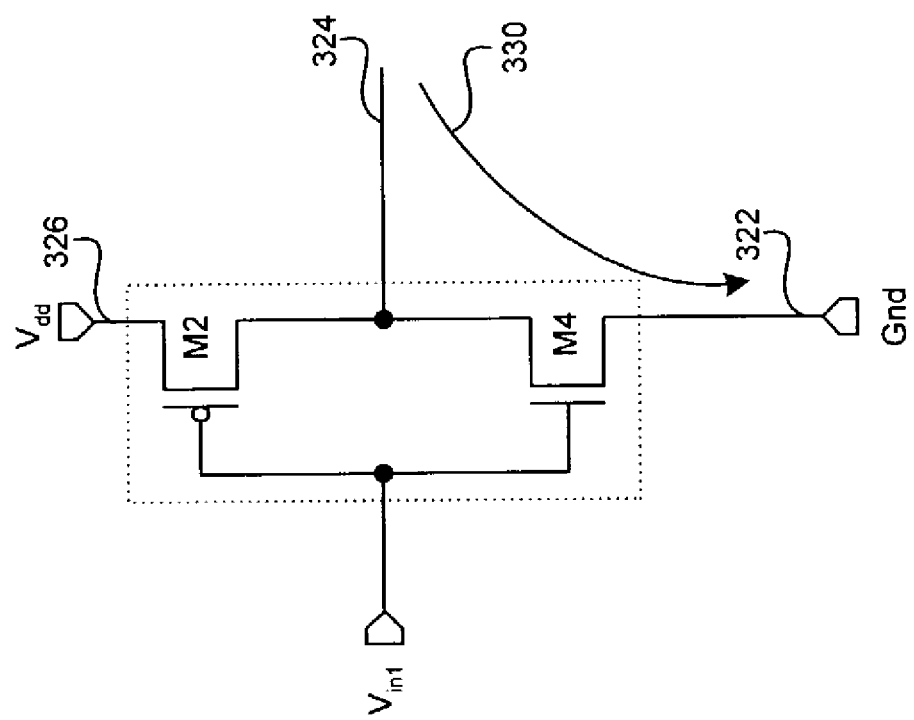
FIG. 3b illustrates the first stage of the self-biasing differential amplifier of FIG. 1 configured as an inverter in accordance with an embodiment of the invention.

FIG. 3b illustrates the first stage of the self-biasing differential amplifier of FIG. 2 configured as an inverter in accordance with an embodiment of the invention. Referring to FIG. 3b, reference 330 indicates the current flow from the output 324 to the ground 322 in instances where there is logic one (1) at input $V_{in1}$, which results in logic zero (0) at output 324.

Figure 3C:
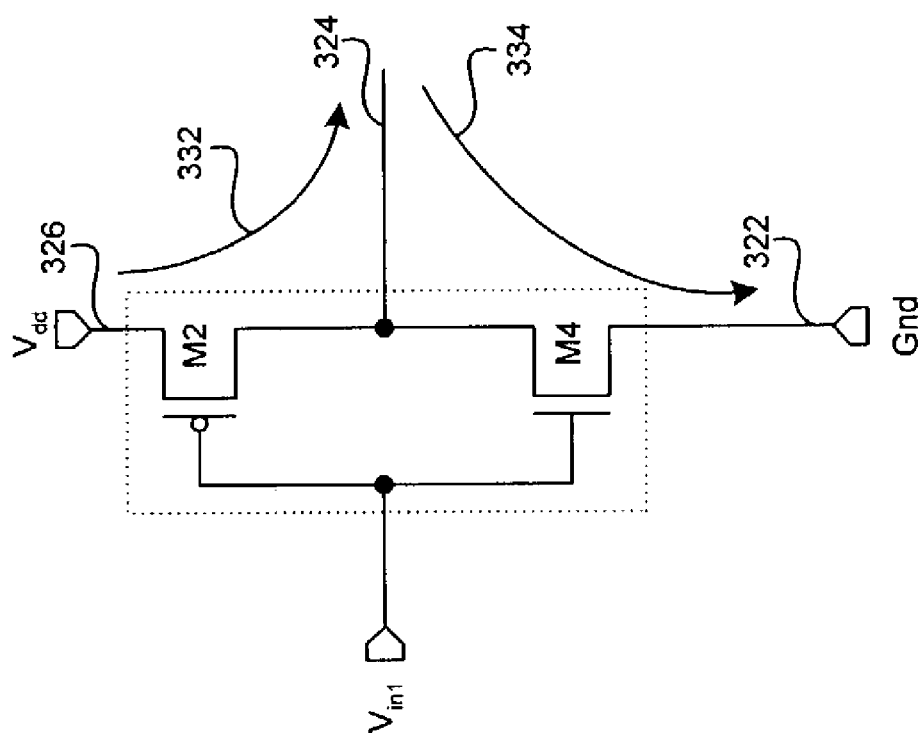
FIG. 3c illustrates an intermediate level for the first stage of the self-biasing differential amplifier of FIG. 1 configured as an inverter in accordance with an embodiment of the invention.

FIG. 3c illustrates an intermediate level for the first stage of the self-biasing differential amplifier of FIG. 2 configured as an inverter in accordance with an embodiment of the invention. Referring to FIG. 3c, in order to achieve an intermediate output level at output 324, an intermediate input voltage such as $½V_{dd}$ may be supplied at the input $V_{in1}$. In this regard, in the transient case, reference 332 indicates the current flow from $V_{dd}$ 326 to the output 324 and reference 334 indicates the current flow from the output 324 to the ground 322. In the DC case, the current will flow from the source of transistor M2 to its drain continuing to the drain of transistor M4 and onto its source. This is commonly referred to as the crowbar current. Notwithstanding, such operation with regard to the first stage of the self-biasing differential amplifier of FIG. 2 may be dependent on the current capability of transistors M2 and M4.

Referring to FIG. 2, the first amplifier stage 210 may be referred to as a first input stage 210 and the second amplifier stage 220 may be referred to as a second input stage 220. In operation, the output signal 224 of the first amplifier stage 210 of the self-biasing differential amplifier may be adapted to control the input of the bias transistor pair 230, which includes PMOS transistor M1 and NMOS transistor M6. In this regard, the higher the voltage $V_{in1}$ that is supplied to the input of the first amplifier stage 210, the lower the output voltage 224, and the lower the voltage that may be applied to the input of the bias transistor pair 230. This may have a net effect of incrementally turning off the NMOS transistor M6 of the bias transistor pair 230, while at the same time incrementally turning on the PMOS transistor M1 of the bias transistor pair 230.

The second input stage 220 sees an input signal that may be differential with respect to the input signal in the first input stage 210. The first input stage may be adapted to control the output of the self-biasing differential amplifier. As the differential signal seen by the second input stage 220 decreases with respect to the first input stage 210, the output of the self-biasing differential amplifier $V_{out}$ may begin to rise as the NMOS transistor M4 of the first input stage 210 turns on, while the PMOS transistor M2 of the first input stage 210 turns off.

In operation, although the input voltage $V_{in1}$ to the first input stage 210 should be greater than or equal to the input voltage $V_{in2}$ of the second input stage 220, there may be instances where this is not so. Accordingly, in instances where the input voltage $V_{in1}$ to the first input stage 210 may be lower than that of the input voltage $V_{in2}$ of the second input stage 220, the output $V_{out}$ of the second input stage 220 may be adapted to produce an amplifier output which decreases. In this regard, as the differential signal seen by the first input stage 210 decreases with respect to the second input stage 220, the output of the self-biasing differential amplifier $V_{out}$ may begin to decrease as the PMOS transistor M3 of the second input stage 220 turns off, while the NMOS transistor M5 of the second input stage 220 turns on.

The self-biasing differential amplifier in accordance with an embodiment of the invention may be adapted to provide a full output swing over a range of input voltages. While some conventional analog differential amplifiers may be adapted to operate only in a very narrowly specified input voltage range, this self-biasing differential amplifier may be adapted to operate over a wider range than some conventional analog differential amplifiers. In one aspect of the invention, the self-biasing differential amplifier may be adapted so that the input voltage differential is intended to operate across a full range of the power supply on the first input stage 210, and between about the mid-rail and ground on the second input stage 220. The first input stage 210 and the second input stage 220 may each commence operation starting at ground and the input voltage $V_{in1}$ supplied to the first input stage 210 may be equal to or higher than the input voltage $V_{in2}$ supplied to the second input stage 2. The self-biasing differential amplifier may be adapted to favor the output $V_{out}$ rising and may thus allow the output $V_{out}$ to achieve a full rail-to-rail CMOS level.

In summary, aspects of the invention provide a self-biasing differential amplifier that may include a first input stage 210 and a biasing transistor pair 230 coupled to the first input stage 210. A second input stage 220 may be coupled to the first input stage 210 and the biasing transistor pair 230. The first input stage 210 of the self-biasing differential amplifier may include a first PMOS transistor M2 coupled to a first NMOS transistor M4 in an inverter arrangement. The second input stage 220 may include a second PMOS transistor M3 coupled to a second NMOS transistor M5. The biasing transistor pair 230 may include a third PMOS transistor M1 coupled to a third NMOS transistor M6.

In light of the foregoing, the invention provides a self-biasing or self-referencing differential amplifier, which requires no additional reference voltage or reference current to properly function. Furthermore, elimination of an additional voltage reference or current reference helps to minimize amplifier complexity. The use of fewer transistors by the self-biasing differential amplifier makes operation of the amplifier more controlled and predictable with respect to process or operating variations, than with conventional differential amplifiers. Additionally, the input voltage of the self-biasing differential amplifier may be configured so that full output CMOS logic levels may be achieved.

Accordingly, the present invention may be realized in hardware, software, or a combination of hardware and software. For example, hardware and/or software may be utilized to control the input voltages $V_{in1}$ and $V_{in2}$. Notwithstanding, the present invention may be realized in a centralized fashion in one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An apparatus for a differential amplifier comprising:
   a first input stage comprising a first PMOS transistor and a first NMOS transistor coupled to said first PMOS, and wherein a source of the first NMOS transistor is directly connected to ground;
   a biasing transistor pair coupled to said first input stage; and a second input stage coupled to said first input stage and said biasing transistor pair.

2. The differential amplifier according to claim 1, wherein the first PMOS transistor and the first NMOS transistor are coupled in an inverter arrangement.

3. The differential amplifier according to claim 2, wherein said second input stage comprises:
   a second PMOS transistor; and
   a second NMOS transistor coupled to said second PMOS transistor.

4. The differential amplifier according to claim 3, wherein said biasing transistor pair comprises:
   a third PMOS transistor; and
   a third NMOS transistor coupled to said third PMOS transistor.

5. The differential amplifier according to claim 4, wherein a gate of said first PMOS transistor is coupled to a gate of said first NMOS transistor.

6. The differential amplifier according to claim 5, further comprising a first input coupled to said coupling gates of said first PMOS transistor and said first NMOS transistor.

7. The differential amplifier according to claim 6, wherein a drain of said first PMOS transistor is coupled to a drain of said first NMOS transistor.

8. The differential amplifier according to claim 7, wherein a gate of said third PMOS transistor is coupled to a gate of said third NMOS transistor.

9. The differential amplifier according to claim 8, wherein said drain of said first PMOS transistor which is coupled to a drain of said first NMOS transistor is coupled to said gate of said third PMOS transistor which is coupled to said gate of said third NMOS transistor.

10. The differential amplifier according to claim, 9, wherein a source of said third NMOS transistor is coupled to a ground.

11. The differential amplifier according to claim 9, wherein a source of said second NMOS transistor is coupled to a drain of said third NMOS transistor.

12. The differential amplifier according to claim 9, wherein a gate of said second PMOS transistor is coupled to a gate of said second NMOS transistor.

13. The differential amplifier according to claim 12, wherein a second input is coupled to said gate of said second PMOS transistor that is coupled to said gate of said second NMOS transistor.

14. The differential amplifier according to claim 9, wherein a drain of said second PMOS transistor is coupled to a drain of said second NMOS transistor.

15. The differential amplifier according to claim 14, wherein an output is coupled to said drain of said second PMOS transistor that is coupled to said drain of said second NMOS transistor.

16. The differential amplifier according to claim 9, wherein a source of said second PMOS transistor is coupled to a source of said first PMOS transistor.

17. The differential amplifier according to claim 16, wherein a drain of said third PMOS transistor is coupled to said source of said second PMOS transistor which is coupled to said source of said first PMOS transistor.

18. The differential amplifier according to claim 9, wherein an effective supply is coupled to a source of said third PMOS transistor.

19. A method for providing a differential amplifier, the method comprising:
- generating an output signal from a first amplifier stage comprising a first PMOS transistor and a first NMOS transistor, wherein a source of the first NMOS transistor is directly connected to ground;
- controlling an input signal to a biasing transistor pair using said generated output from said first amplifier stage; and
- generating an output signal from a second amplifier stage coupled to said first amplifier stage and said biasing transistor pair, said second amplifier stage comprising a second PMOS transistor and a second NMOS transistor.

20. The method according to claim 19, wherein said biasing transistor pair comprises a third PMOS transistor and a third NMOS transistor.

21. The method according to claim 20, further comprising:
- incrementally turning off said third NMOS transistor; and
- simultaneously incrementally turning on said third PMOS transistor during said turning off of said third NMOS transistor.

22. The method according to claim 21, further comprising:
- incrementally turning on said third NMOS transistor; and
- simultaneously incrementally turning off said third PMOS transistor during said turning on of said third NMOS transistor.

23. The method according to claim 22, further comprising:
- turning on said second PMOS transistor; and
- simultaneously turning off said second NMOS transistor during said turning on of said third PMOS transistor.

24. The method according to claim 19, wherein said generated output from said first amplifier stage is a voltage reference signal.

* * * * *